United States Patent
Lee et al.

[11] Patent Number: 6,150,185
[45] Date of Patent: Nov. 21, 2000

[54] METHODS OF MANUFACTURING AND TESTING INTEGRATED CIRCUIT FIELD EFFECT TRANSISTORS USING SCANNING ELECTRON MICROSCOPE TO DETECT UNDESIRED CONDUCTIVE MATERIAL

[75] Inventors: Sang-hun Lee; Yong-ju Kim; Sang-kyu Hahm; Sang-kil Lee, all of Kyungki-do, Rep. of Korea

[73] Assignee: Samsung Electronics Co., Ltd., Rep. of Korea

[21] Appl. No.: 09/067,195

[22] Filed: Apr. 27, 1998

[30] Foreign Application Priority Data

Jul. 25, 1997 [KR] Rep. of Korea ...................... 97-35180

[51] Int. Cl.⁷ .................................................. H01L 21/00
[52] U.S. Cl. .............................................................. 438/12
[58] Field of Search .................................. 438/5, 12, 13, 438/8, 9, 14, 16, 18, 689, 720, 721, 800; 257/213, 202, 798

[56] References Cited

U.S. PATENT DOCUMENTS 5,665,203   9/1997   Lee et al. ................................ 438/585

*Primary Examiner*—Charles Bowers
*Assistant Examiner*—Craig Thompson
*Attorney, Agent, or Firm*—Myers Bigel Sibley & Sajovec

[57] ABSTRACT

Scanning Electron Microscope (SEM) analysis is used to detect undesired conductive material on the gate sidewall spacers. The undesired conductive material is then etched from the sidewall spacers if the undesired material is detected by the SEM analysis. More specifically, integrated circuit field effect transistors may be manufactured by forming on an integrated circuit substrate, a plurality of field effect transistors, each comprising spaced apart source and drain regions, a gate therebetween including a sidewall, a sidewall spacer on the sidewall and contacts comprising conductive material on the source and drain regions. At least one of the field effect transistors may include undesired conductive material on the sidewall spacer thereof. The integrated circuit field effect transistors are tested by performing SEM analysis on the integrated circuit substrate to detect the undesired conductive material on the sidewall spacer. The undesired conductive material is then etched from the sidewall spacer if the undesired material is detected by the SEM analysis.

16 Claims, 4 Drawing Sheets

METHODS OF MANUFACTURING AND TESTING INTEGRATED CIRCUIT FIELD EFFECT TRANSISTORS USING SCANNING ELECTRON MICROSCOPE TO DETECT UNDESIRED CONDUCTIVE MATERIAL

FIELD OF THE INVENTION

This invention relates to integrated circuit manufacturing and testing methods, and more particularly to methods of manufacturing and testing integrated circuit field effect transistors.

BACKGROUND OF THE INVENTION

Integrated circuit field effect transistors are widely used in integrated circuits including but not limited to logic devices and memory devices. As the integration density of integrated circuits continues to increase, line widths of 0.2 μm or less may be used in the integrated circuits.

Due to the decreasing line width, it may become increasingly difficult to detect defects in the integrated circuits. A particular problem in manufacturing integrated circuit field effect transistors is the detection of undesired conductive material on gate sidewalls and on inactive regions of the integrated circuit substrates. The formation of integrated circuit field effect transistors, including undesired conductive material on the gate sidewalls and on the inactive regions, will now be described with references to FIGS. 1–5.

FIGS. 1–5 illustrate the formation of N-channel field effect transistors. However, similar processes may be used to form P-channel field effect transistors and integrated circuits including both N-channel and P-channel field effect transistors, also referred to as CMOS integrated circuits.

Referring now to FIG. 1, isolation regions such as field oxide regions 28 are formed in an integrated circuit substrate, such as a silicon semiconductor substrate 10. The field oxide regions 28 form inactive regions of the integrated circuit substrate, and the regions therebetween define active regions of the integrated circuit substrate.

Continuing with the description of the FIG. 1, a field effect transistors is formed in the active region by forming a P-well 12 in the active region, for example using boron or other trivalent dopants. A gate oxide layer 16 and a conductive gate electrode 18 comprising for example doped polysilicon, is formed within the active region. Spaced apart source and drain regions 14 are then formed by forming two N-wells using for example pentavalent dopings. It will be understood that the source and drain regions 14 may be formed by implanting N-type dopants into the substrate using the gate electrode 18 as a mask. Alternatively, the source and drain regions 14 may be formed prior to forming the gate oxide 16 and/or gate electrode 18.

Referring now to FIG. 2, a silicon nitride film 20 is then formed on the integrated circuit substrate 10. As shown in FIG. 3, the silicon nitride film 20 is patterned to form a sidewall spacer 22 on the sidewall of the gate electrode 18. Then, as shown in FIG. 4, a conductive material such as titanium 24 is formed on the field effect transistor, including on the spaced apart source and drain regions 14, on the gate 18 and on the sidewall spacer 22.

Then, referring to FIG. 5, the titanium 24 is heated to react the titanium 24 with the silicon in the spaced apart source and drain regions to form titanium silicide source and drain contacts 26a and a titanium silicide gate contact 26b.

Still referring to FIG. 5, the remaining titanium 24 is then removed from the field oxide 28 and from the gate sidewall spacer 22 by etching, for example using sulfuric acid. The sulfuric acid reacts with the titanium to etch the titanium but does not readily react with titanium silicide, so that titanium silicide source and drain contacts 26a and gate contact 26b remain.

Unfortunately, as illustrated in FIG. 5, undesired titanium 24a may remain on the field oxide regions 28 and undesired titanium 24b may remain on the sidewall spacer, due to incomplete removal by the sulfuric acid etch. The undesired titanium 24b on the sidewall spacer 22 may cause short circuits in the integrated circuit, which can reduce the yields and/or reliability of the integrated circuit devices. Moreover, the undesired titanium 24a on the field oxide regions 28 can increase the leakage current of the field effect transistors, which can degrade the performance thereof.

Detection of undesired titanium 24a and 24b may become increasingly difficult as the size of the field effect transistors continues to shrink and the number of field effect transistors that are formed in an integrated circuit continues to increase.

SUMMARY OF THE INVENTION

It is therefore an object of the present invention to provide improved methods of manufacturing and testing integrated circuit field effect transistors.

It is another object of the present invention to provide methods of manufacturing and testing integrated circuit field effect transistors that can detect undesired conductive material on the gate sidewall spacers and in the inactive region.

It is yet another object of the present invention to provide methods of removing undesired conductive material on the sidewall spacers and/or the active regions of the integrated circuit substrates.

These and other objects are provided, according to the present invention, by using Scanning Electron Microscope (SEM) analysis to detect undesired conductive material on the gate sidewall spacers. The undesired conductive material is then etched from the sidewall spacers if the undesired material is detected by the SEM analysis.

As is well known to those having skill in the art, in SEM analysis, an electron beam is generated after an acceleration voltage is applied to a filament inside an electron gun. The electron beam is scanned on a reference, to generate secondary electrons by the interaction between the scanned electrons and the atoms in the reference. The secondary electrons are detected and amplified as necessary. The detected secondary electrons may be converted into an analog signal or a digital signal, so that a light and dark image of the reference may be generated in a Braun tube or other display device. SEM analysis has heretofore been used to measure the size of a contact hole in an integrated circuit and to measure the distance between patterns formed on an integrated circuit, also referred to as a "critical dimension".

According to the invention, SEM analysis is used to detect undesired conductive material on the gate sidewall spacers and etching is performed to remove the undesired conductive material from the sidewall spacer if undesired material is detected by the SEM analysis. Removal of the undesired conductive material from the sidewall spacer can improve the reliability and/or yields of microelectronic devices. The SEM analysis may also be used to detect undesired conductive material on the inactive regions of the integrated circuit, such as the field oxide regions. Etching may be used to remove the undesired conductive material from the inactive regions. This can reduce the leakage currents in the integrated circuits and thereby improve the performance thereof.

More specifically, according to the invention, integrated circuit field effect transistors may be manufactured by forming on an integrated circuit substrate, a plurality of field effect transistors, each comprising spaced apart source and drain regions, a gate therebetween including a sidewall, a sidewall spacer on the sidewall and contacts comprising conductive material on the source and drain regions. At least one of the field effect transistors may include undesired conductive material on the sidewall spacer thereof. The integrated circuit field effect transistors are tested by performing SEM analysis on the integrated circuit substrate to detect the undesired conductive material on the sidewall spacer. The undesired conductive material is then etched from the sidewall spacer if the undesired material is detected by the SEM analysis.

According to another aspect of the invention, the integrated circuit substrate includes an active region containing the plurality of field effect transistors and an inactive region. The inactive region may also include undesired conductive material thereon. The SEM analysis may be used to detect the undesired conductive material on the sidewall spacer and on the inactive region. The etching step may be used to etch the undesired conductive material from the sidewall spacer and from the inactive region if the undesired material is detected by SEM analysis.

In a specific integrated circuit field effect transistor manufacturing process, a plurality of field effect transistors are formed on an integrated circuit substrate, each comprising spaced apart source and drain regions and a gate therebetween including a sidewall spacer. A layer comprising conductive material is formed on the plurality of field effect transistors including on the spaced apart source and drain regions, on the gate and on the sidewall spacer. The integrated circuit is then heated to react the layer of conductive material with the spaced apart source and drain regions to form silicide source and drain contacts. A selective etching process is performed to remove the layer of conductive material while the silicide source and drain contact regions remain. However, at least one of the field effect transistors includes undesired conductive material remaining on the sidewall spacer. In order to etch the undesired material from the sidewall spacer, the selective etching step may again be performed to etch undesired conductive material from the sidewall spacer. The same process may be used to detect undesired conductive material on the inactive regions and to remove the undesired conductive material from the inactive regions.

In performing the SEM analysis, acceleration voltages of between 10 kV and 30 kV may be used to detect the undesired conductive material on the sidewall spacers. Moreover, at least one dummy field effect transistor may be provided in the integrated circuit that is unconnected to remaining ones of the field effect transistors. The SEM analysis may then be performed on a dummy field effect transistor to detect the undesired material on the sidewall spacer thereof. Thus, any damage that may be produced by the SEM analysis need only affect the dummy field effect transistors. The dummy field effect transistors may be formed in a scribe region between integrated circuit chips or in other inactive regions of the integrated circuit. Alternatively, SEM analysis may be performed on one of the active field effect transistors to detect the undesired conductive material on the sidewall spacer.

In one embodiment of the present invention, the sidewall spacer comprises silicon nitride and the conductive layer comprises titanium silicide. Undesired titanium may remain on the sidewall spacer and/or on the inactive region as a result of etching in sulfuric acid. If SEM analysis detects the undesired titanium, a second etch with sulfuric acid may be performed to remove the undesired titanium from the sidewall spacer and/or the inactive regions. By removing undesired conductive material from the sidewall spacers and the inactive region, improved performance and/or improved reliability of integrated circuit devices may be obtained.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 1:
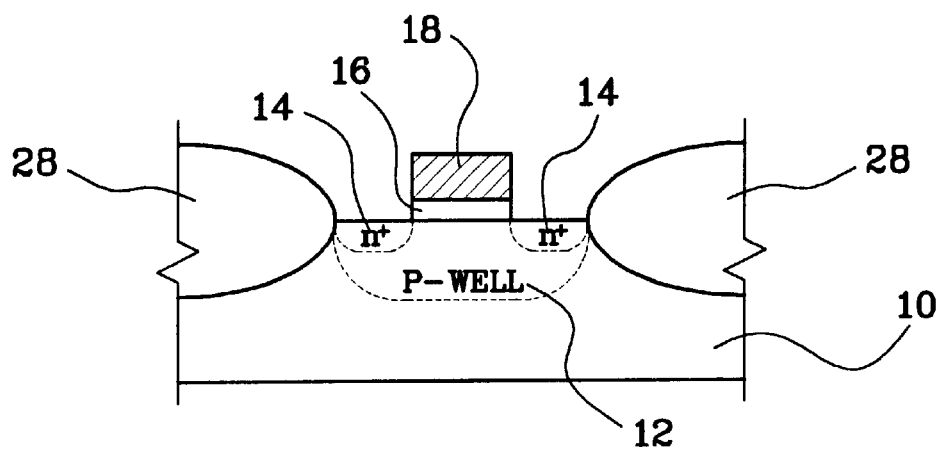
FIGS. 1–5 are cross-sectional views illustrating conventional integrated circuit field effect transistors during intermediate fabrication steps.
Figure 2:
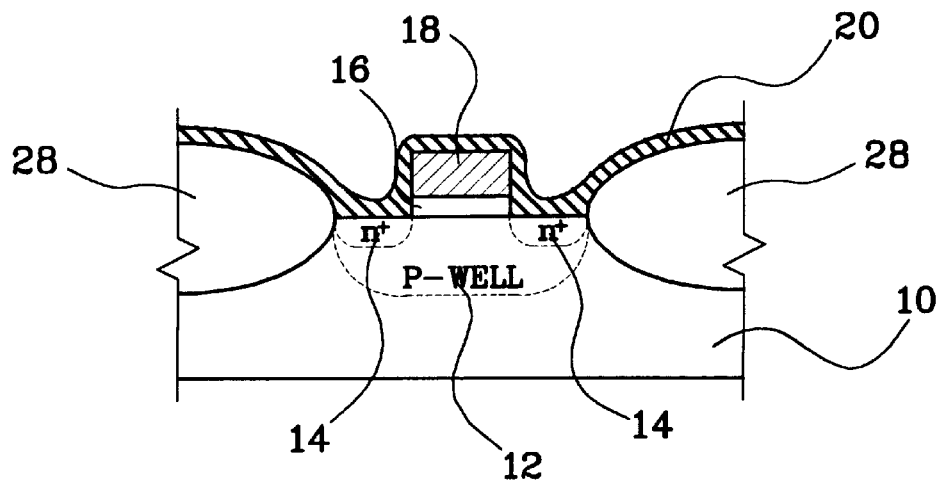
Figure 3:
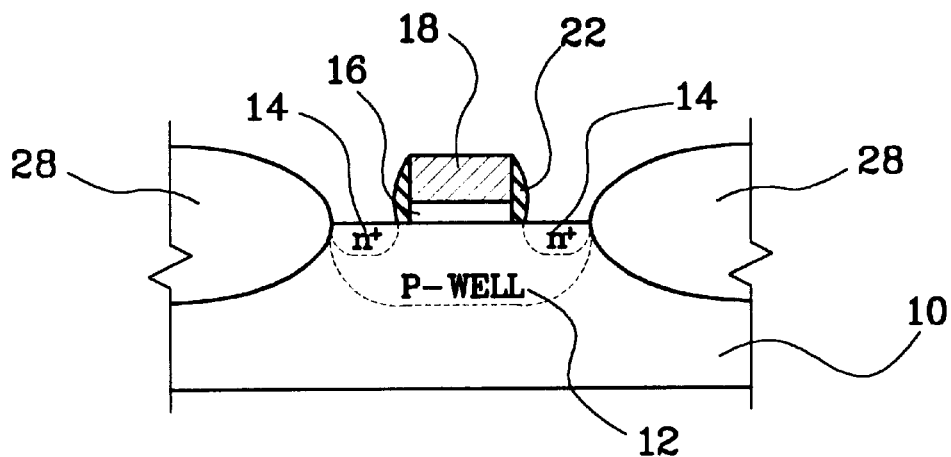
Figure 4:
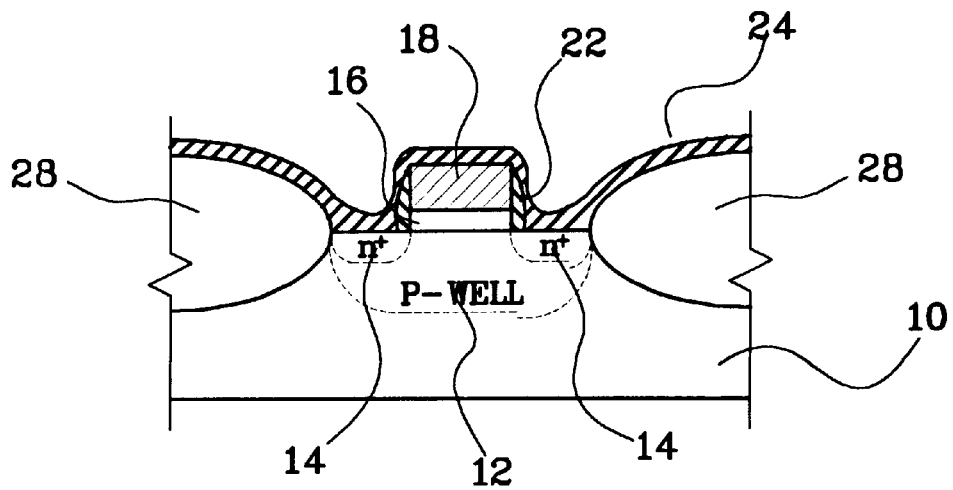
Figure 5:
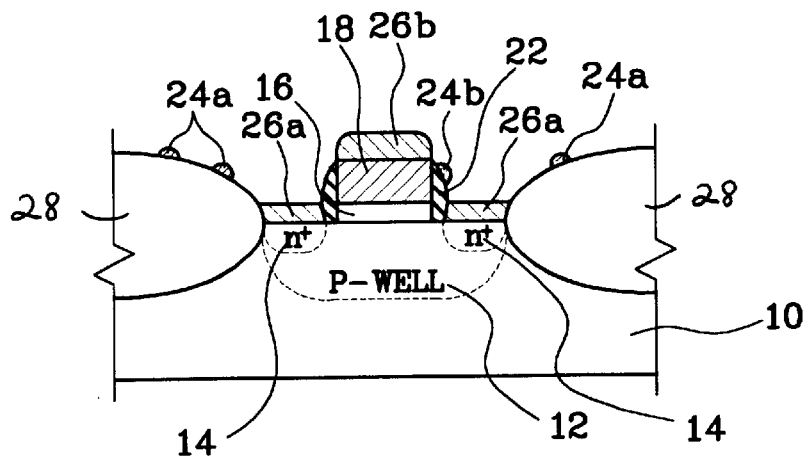
Figure 6:
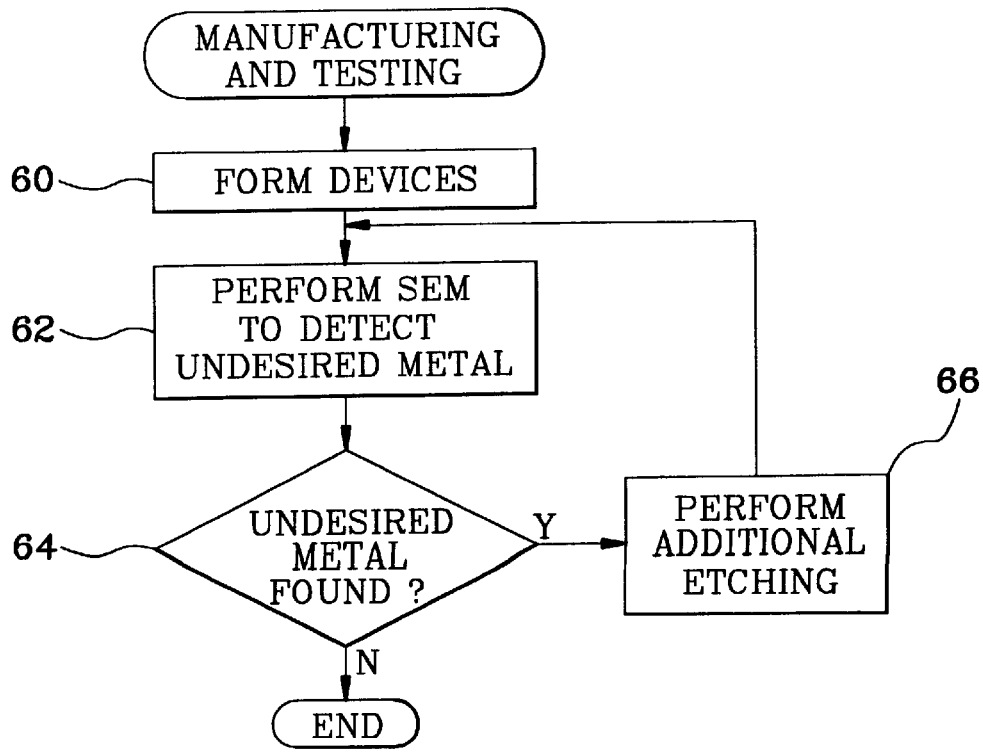
FIG. 6 is a flowchart illustrating steps of manufacturing and testing integrated circuit field effect transistors according to the invention.

FIG. 6 is a flowchart illustrating methods of manufacturing and testing integrated circuit field effect transistors according to the invention. As shown in Block 60, a plurality of field effect transistors is formed in an integrated circuit substrate. Integrated circuit field effect transistors may be formed as was described in connection with FIGS. 1–5. Thus, each integrated circuit field effect transistor includes spaced apart source and drain regions, a gate therebetween including a sidewall, a sidewall spacer on the sidewall and contacts comprising conductive material on the source and drain regions. The sidewall preferably comprises silicon nitride and the contacts preferably comprise titanium silicide. At least one of the field effect transistors may include undesired conductive material such as residual titanium on the sidewall spacers thereof.

As was already described, the undesired conductive material may result from forming a layer comprising conductive material on the field effect transistors including on the spaced apart source and drain regions, on the gate and on the sidewall spacer, and then heating the integrated circuit to react the layer of conductive material with the spaced apart source and drain regions to form silicide source and drain contacts. The remaining conductive material such as titanium is selectively etched to remove the layer of conductive material while the silicide source and drain contacts remain. However, at least one of the field effect transistors may include undesired conductive material remaining on the sidewall spacer and/or on the inactive regions.

As shown in Block 62, SEM analysis is performed to detect the undesired material. For example, SEM analysis may be used to detect whether titanium exists on the sidewall spacer and/or on the inactive region of the integrated circuit. The SEM analysis is preferably carried out using an acceleration voltage that is applied to the filament of the electron gun of between about 10 to about 30 kV and preferably about 15 kV. This relatively high voltage can be used to increase the intensity of the released electron beam from the integrated circuit.

Figure 7:
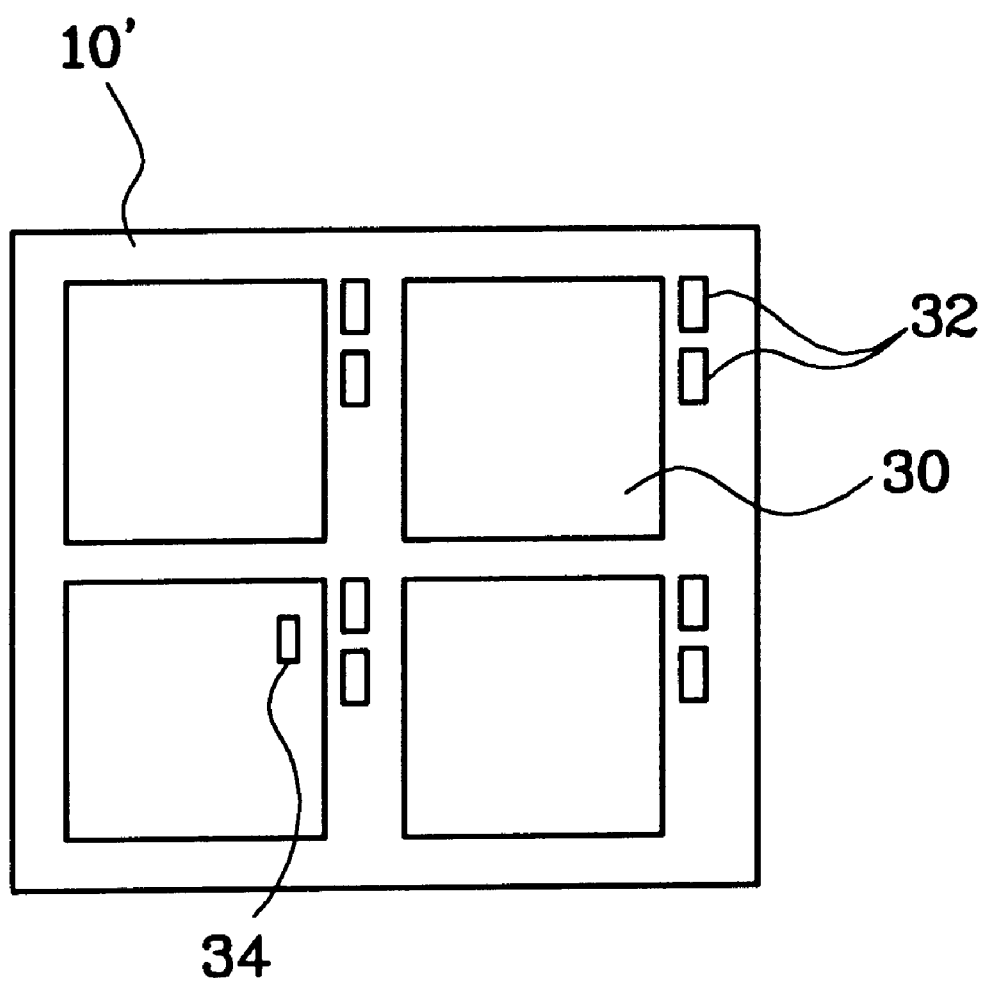
FIG. 7 is a schematic view of integrated circuit substrates including dummy field effect transistors according to the present invention.

In performing SEM analysis, scanning may be performed over all of the active portions of the integrated circuit. For example, as shown in FIG. 7, an integrated circuit substrate 10' may include arrays of field effect transistors that are arranged in memory cell blocks 30. The field effect transistors in the memory cell blocks 30 may be scanned to detect undesired material. Alternatively, a predetermined one or ones of the field effect transistors may be scanned. Thus, a specific field effect transistor or a grouping of field effect transistors 34 at a particular location on the integrated circuit may be scanned.

In yet another alternative, dummy field effect transistors 32 may be formed outside the active field effect transistors in the device. The dummy field effect transistors 32 are unconnected to the remaining field effect transistors 30. Thus, if the SEM analysis damages a scanned field effect transistor, it will only damage the unused dummy field effect transistors 32. The dummy field effect transistors 32 may be located on a scribe line of a semiconductor wafer that is later scribed into integrated circuits. These dummy field effect transistors may also be used as an alignment mark during exposure or lithography steps or as a measuring point in a measuring step. The dummy field effect transistor preferably has the same structure as an active field effect transistor, but is generally not connected electrically to the other field effect transistors.

Returning again to FIG. 6, at Block 64 it is determined whether undesired metal is found. If metal such as titanium exists on the sidewall spacer and/or the inactive regions, the electron beam which is accelerated by about 15 kV of acceleration voltage and irradiated on the dummy pattern 32 on the active field effect transistors 30 or on specific ones of the active field effect transistors 34, is captured by the undesired metal. As a result, a dark image is shown on the Braun tube of the SEM.

If a dark image or other indication of undesired metal is found at Block 64, then at Block 66 additional etching is performed to remove the undesired conductive material from the sidewall and/or the inactive regions. Preferably, the same etching process that was used to fabricate the field effect transistors is used. Thus, in the example of FIGS. 1–5, etching in sulfuric acid is used.

Accordingly, undesired conductive material in integrated circuit field effect transistors may be detected and removed, to thereby allow improvement in yield, reliability and/or performance of the integrated circuit field effect transistors.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of manufacturing integrated circuit field effect transistors comprising the steps of:

forming on an integrated circuit substrate, a plurality of field effect transistors, each comprising spaced apart source and drain regions, a gate therebetween including a sidewall, a sidewall spacer on the sidewall and contacts comprising conductive material on the source and drain regions, wherein at least one of the plurality of field effect transistors may include undesired conductive material on the sidewall spacer thereof;

performing Scanning Electron Microscope (SEM) analysis on the integrated circuit substrate to detect the undesired conductive material on the sidewall spacer; and etching the undesired conductive material from the sidewall spacer if the undesired material is detected by the SEM analysis.

2. A method according to claim 1 wherein the integrated circuit substrate includes an active region containing the plurality of field effect transistors and an inactive region, and wherein the inactive region may also include undesired conductive material thereon;

wherein the performing step comprises the step of performing SEM analysis on the integrated circuit substrate to detect the undesired conductive material on the sidewall spacer and on the inactive region; and wherein the etching step comprises the step of etching the undesired conductive material from the sidewall spacer and from the inactive region if the undesired material is detected by the SEM analysis.

3. A method according to claim 1 wherein the forming step comprises the steps of:

forming on an integrated circuit substrate, a plurality of field effect transistors, each comprising spaced apart source and drain regions and a gate therebetween including a sidewall spacer;

forming a layer comprising conductive material on the plurality of field effect transistors including on the spaced apart source and drain regions, on the gate and on the sidewall spacer;

heating the integrated circuit to react the layer of conductive material with the spaced apart source and drain regions to form silicide source and drain contacts; and selectively etching to remove the layer of conductive material while the silicide source and drain contacts remain, wherein at least one of the plurality of field effect transistors includes the undesired conductive material remaining on the sidewall spacer.

4. A method according to claim 3 wherein the etching step comprises the step of:

again performing the selectively etching step to etch the undesired conductive material from the sidewall spacer if the undesired material is detected by the SEM analysis.

5. A method according to claim 1 wherein the forming step comprises the steps of:

forming on an integrated circuit substrate, an active region and an inactive region;

forming in the active region, a plurality of field effect transistors, each comprising spaced apart source and drain regions and a gate therebetween including a sidewall spacer;

forming a layer comprising conductive material on the plurality of field effect transistors including on the spaced part source and drain regions, on the gate, on the sidewall spacer, and on the inactive region;

heating the integrated circuit to react the layer of conductive material with the spaced apart source and drain regions to form silicide source and drain contacts; and selectively etching to remove the layer of conductive material while the silicide source and drain contacts remain, wherein at least one of the plurality of field effect transistors may include undesired conductive material remaining on the sidewall spacer and wherein undesired conductive material may also remain on the inactive region.

6. A method according to claim 5 wherein the etching step comprises the step of:

again performing the selectively etching step to etch the undesired conductive material from the sidewall spacer and from the inactive region if the undesired material is detected by the SEM analysis.

7. A method according to claim 1 wherein the performing step comprises the step of performing SEM analysis on the integrated circuit substrate including the plurality of field effect transistors, at acceleration voltages of between 10 kV and 30 kV, to detect the undesired conductive material on the sidewall spacers.

8. A method according to claim 1 wherein at least one of the field effect transistors is a dummy field effect transistor that is unconnected to remaining ones of the plurality of field effect transistors, and wherein the performing step comprises the step of performing SEM analysis on the dummy field effect transistor to detect the undesired conductive material on the sidewall spacer thereof.

9. A method according to claim 1 wherein the performing step comprises the step of performing SEM analysis on a predetermined one of the plurality of field effect transistors to detect the undesired conductive material on the sidewall spacer thereof.

10. A method according to claim 1 wherein the sidewall spacer comprises silicon nitride, wherein the conductive layer comprises titanium silicide and wherein the etching step comprises the step of etching the undesired titanium from the sidewall spacer using sulfuric acid, if the undesired titanium is detected by the SEM analysis.

11. A method of testing integrated circuit substrate including a plurality of field effect transistors, each comprising spaced apart source and drain regions, a gate therebetween including a sidewall, a sidewall spacer on the sidewall and contacts comprising conductive material on the source and drain regions, wherein at least one of the plurality of field effect transistors may include undesired conductive material on the sidewall spacer, the testing method comprising the steps of:

performing Scanning Electron Microscope (SEM) analysis on the integrated circuit substrate to detect the undesired conductive material on the sidewall spacer; and etching the undesired conductive material from the sidewall spacer if the undesired material is detected by the SEM analysis.

12. A method according to claim 11 wherein the integrated circuit substrate includes an active region containing the plurality of field effect transistors and an inactive region, and wherein the inactive region may also include undesired conductive material thereon;

wherein the performing step comprises the step of performing SEM analysis on the integrated circuit substrate to detect the undesired conductive material on the sidewall spacer and on the inactive region; and wherein the etching step comprises the step of etching the undesired conductive material from the sidewall spacer and from the inactive region if the undesired material is detected by the SEM analysis.

13. A method according to claim 11 wherein the performing step comprises the step of performing SEM analysis on the integrated circuit substrate including the plurality of field effect transistors, at acceleration voltages of between 10 kV and 30 kV, to detect the undesired conductive material on the sidewall spacer.

14. A method according to claim 11 wherein at least one of the field effect transistors is a dummy field effect transistor that is unconnected to remaining ones of the plurality of field effect transistors, and wherein the performing step comprises the step of performing SEM analysis on the dummy field effect transistor to detect the undesired conductive material on the sidewall spacer thereof.

15. A method according to claim 11 wherein the performing step comprises the step of performing SEM analysis on a predetermined one of the plurality of field effect transistors to detect the undesired conductive material on the sidewall spacer thereof.

16. A method according to claim 11 wherein the sidewall spacer comprises silicon nitride, wherein the conductive layer comprises titanium silicide and wherein the etching step comprises the step of etching undesired titanium from the sidewall using sulfuric acid, if the undesired titanium is detected by the SEM analysis.

* * * * *